(12) United States Patent
Blomberg

(10) Patent No.: US 7,846,499 B2
(45) Date of Patent: Dec. 7, 2010

(54) METHOD OF PULSING VAPOR PRECURSORS IN AN ALD REACTOR

(75) Inventor: Tom E. Blomberg, Vantaa (FI)

(73) Assignee: ASM International N.V., Almere (NL)

( * ) Notice: Subject to any disclaimer, the term of this patent is extended or adjusted under 35 U.S.C. 154(b) by 1467 days.

(21) Appl. No.: 11/026,208

(22) Filed: Dec. 30, 2004

(65) Prior Publication Data

US 2006/0147626 A1    Jul. 6, 2006

(51) Int. Cl.
 C23C 16/455   (2006.01)
 C30B 25/14    (2006.01)

(52) U.S. Cl. .............. 427/255.23; 427/255.28; 117/85; 117/89

(58) Field of Classification Search .......... 427/255.23, 427/255.28; 117/85, 89
See application file for complete search history.

(56) References Cited

U.S. PATENT DOCUMENTS

| | | | |
|---|---|---|---|
| 4,389,973 A | | 6/1983 | Suntola et al. |
| 5,879,459 A | * | 3/1999 | Gadgil et al. ............ 118/715 |
| 6,475,276 B1 | * | 11/2002 | Elers et al. ............... 117/84 |
| 6,585,823 B1 | * | 7/2003 | Van Wijck ............... 117/89 |
| 6,630,201 B2 | * | 10/2003 | Chiang et al. .......... 427/255.28 |
| 6,812,157 B1 | * | 11/2004 | Gadgil .................... 438/763 |
| 6,902,620 B1 | * | 6/2005 | Omstead et al. ......... 117/107 |
| 7,060,132 B2 | * | 6/2006 | Lindfors et al. ........... 117/93 |
| 7,141,095 B2 | * | 11/2006 | Aitchison et al. ......... 95/273 |
| 7,404,984 B2 | * | 7/2008 | Suntola et al. .......... 427/248.1 |
| 2003/0221780 A1 | * | 12/2003 | Lei et al. ............... 156/345.29 |
| 2005/0016956 A1 | * | 1/2005 | Liu et al. ................ 216/67 |

FOREIGN PATENT DOCUMENTS

| | | |
|---|---|---|
| FI | 57975 | 11/1980 |
| WO | WO 03/062490 A2 | 7/2003 |
| WO | WO 2004/083485 A2 | 9/2004 |

OTHER PUBLICATIONS

Technology Backgrounder: Atomic Layer Deposition from ICKnowledge LLC. pp. 1-7, 2004.*

* cited by examiner

*Primary Examiner*—Bret Chen
(74) *Attorney, Agent, or Firm*—Knobbe, Martens, Olson & Bear LLP

(57) ABSTRACT

A method of growing a thin film on a substrate by pulsing vapor-phase precursors material into a reaction chamber according to the ALD method. The method comprises vaporizing at least one precursor from a source material container maintained at a vaporising temperature, repeatedly feeding pulses of the vaporized precursor via a feed line into the reaction chamber at a first pressure, and subsequently purging the reaction chamber with pulses of inactive gas fed via the feed line at a second pressure. The second pressure is maintained at the same as or a higher level than the first pressure for separating successive pulses of said vaporized precursor from each other.

26 Claims, 2 Drawing Sheets

METHOD OF PULSING VAPOR PRECURSORS IN AN ALD REACTOR

BACKGROUND OF THE INVENTION

1. Field of the Invention

The present invention relates to the production of thin films by a gas phase deposition method comprising the steps of pulsing the precursors into a reaction chamber containing a substrate, onto which the thin film is grown. In particular, the invention concerns a method for producing thin films by an ALD (Atomic Layer Deposition) type method.

2. Description of the Related Art

Thin film manufacturing is traditionally divided into Chemical (CVD) and Physical Vapor Deposition (PVD) techniques. A relatively fast film growth is achieved at low substrate temperatures by Molecular Beam Epitaxy (MBE) or sputtering methods, belonging to the PVD group. In these methods, the quality of the film and the controllability of its thickness are, however, insufficient for many present-day microelectronic applications. A method known as Pulsed Laser Deposition (abbreviated PLD) provides for better thickness control at the expense of film growth speed, but several layers are still deposited at once in PLD.

In CVD, chemical reactions taking place on the surface of the substrate are utilized to grow a more uniform film. CVD methods require higher substrate temperatures than the PVD methods, but generally offer superior film quality. In PVD and in conventional CVD, including low-pressure, metal-organic and plasma-enhanced CVD methods, besides other process variables, thin-film growth rate is influenced by the concentrations of the starting material inflows. To achieve a uniform thickness of the layers deposited by these methods, the concentrations and reactivities of the starting materials must hence be carefully kept constant over the whole substrate area.

Atomic Layer Deposition (ALD), formerly known as Atomic Layer Epitaxy (ALE), is a promising CVD-derived method for growing highly uniform thin films onto a substrate. The substrate is placed into a high-vacuum reaction space free of impurities and at least two different volatile precursors are injected in vapor phase alternately and repetitively into the reaction space. The film growth is based on surface reactions that take place on the surface of the substrate to form a solid-state layer of atoms or molecules, because the precursors and the temperature of the substrate are chosen such that the alternately-injected vapor-phase precursor's molecules react only on the substrate with its surface layer. The precursors are injected in sufficiently high doses for the surface to be fully saturated during each injection cycle. Therefore, the process is highly self-regulating, being not dependent on the concentration of the starting materials, whereby it is possible to achieve extremely high film uniformity and a thickness accuracy of a single atomic or molecular layer.

The principles of ALD type processes have been presented by the pioneer of the ALD technology, Dr. T. Suntola, e.g. in Handbook of Crystal Growth 3, Thin Films and Epitaxy, Part B: Growth Mechanisms and Dynamics, Chapter 14, "Atomic Layer Epitaxy", pp. 601-663, Elsevier Science B.V. 1994, the disclosure of which is incorporated herein by reference. The ALD method is described in more detail in FI Patents Nos. 52,359 and 57,975 and in U.S. Pat. Nos. 4,058,430 and 4,389,973, in which also some apparatus embodiments suited to implement this method are disclosed. The contents of these documents are herewith incorporated by reference. Various ALD reactor constructions for growing thin films can also to be found in the following publications: Material Science Reports 4(7) (1989), p. 261, and Tyhjiötekniikka (Finnish publication for vacuum techniques), ISBN 951-794-422-5, pp. 253-261, the contents of which are herewith incorporated by reference.

The ALD method can be used for growing both elemental and compound thin films. Of the elemental films, the most common ones are the silicon films, which are widely used in the microelectronic component industry. Typical compound films are, for example, ZnS, $Al_2O_3$ and $SiO_2$ films needed in a variety of electronic applications. New precursors are continuously being developed for enabling manufacture of more complex and specialized films.

Growing a film using the ALD method is a slow process due to its step-wise (layer-by-layer) nature. At least two precursor pulses are needed to form one layer of the desired compound, and the pulses have to be kept separated from each other for preventing uncontrolled growth of the film and contamination of the ALD reactor. After each pulse, the gaseous reaction products of the thin-film growth process as well as the excess reactants in vapor phase have to be removed from the reaction space. This can be achieved either by pumping down the reaction space or by purging the reaction space with an inactive gas flow between successive pulses. In the latter method, a column of an inactive gas is formed in the conduits between the precursor pulses. The latter method is more widely employed on production scale because of its efficiency and its capability of forming an effective diffusion barrier between the successive pulses. Regularly, the inert purging gas is also used as a carrier gas during precursor pulses, diluting the precursor gas before it is fed into the reaction space. Some ALD reactors employing purging with inert gas are called flow-type or travelling wave reactors. A reactor or this kind is disclosed in FI Patent No. 57,975 and the corresponding U.S. Pat. No. 4,389,973.

There are two general prerequisites to make a travelling wave reactor. First, the system should be operated in the viscous flow regime, and second, after the introduction of the precursor pulses, the flow has to be maintained laminar. The first prerequisite stems from the fact that if the reactor is not being operated in the viscous flow regime, laminar flow does not exist. This gives a lower pressure limit of about 1 mbar for a travelling wave reactor. The laminarity of gas inflow may also become disturbed by a too tight bend in the piping. The second prerequisite sets a higher limit of about 2000 to the Reynolds number RN of the system, RN being defined by formula (1)

$$R_N = \frac{vd}{v}, \qquad (1)$$

wherein v is the velocity of gas,
d is the diameter of flow channel and v is the kinematic viscosity of fluid.

This higher limit for $R_N$ is, however, only desirable, not mandatory, because in practice, if the reactor is aerodynamically well designed, it may work sufficiently well also with higher Reynolds numbers. That is, the reactor may, in fact, be driven also in turbulent flow regime or in a laminar-turbulent flow transition zone ($2000 < R_N < 4000$). Even though the reactor being such designed that the flow is mainly laminar, the Reynolds number is regularly exceeded in a short gas mixing area, where some turbulence may exist. However, it is generally preferred to operate the reactor in the laminar flow regime.

Sufficient substrate exposure and good purging of the reaction space are desirable for a successful ALD process. That is, the pulses should be intense enough for the substrate to be saturated and purging should be efficient enough to remove practically all precursor residues and undesired reaction products from the reactor. With the present travelling-wave reactor technology, the purge times required are relatively long with respect to the precursor exposure times.

In order to accelerate the film growth process, there is a demand for methods that enable shortening of the purge periods and, thus, the pulse intervals.

Along with well-established substrate exposure and purging of the reaction space, one of the most restrictive factors contributing to the process cycle times is a temporal widening of the precursor pulses. Successive pulses have to be kept sufficiently separated, because they are mixed if fed with too frequent intervals due to their finite rise and drop times. A widening of the pulse is the result of three main phenomena: a pressure gradient is formed between the precursor and inert gas flows, diffusion, and gases are adsorbed onto and they are desorbed from the surfaces of the reactor. All these effects cause mixing of the precursor gas and the inert gas, and it generates a need for long purge times to ensure operation under proper ALD conditions. Diffusion is inevitable and it sets the theoretical lower limit for the width of the pulse. The "memory effect" caused by absorption and desorption of gases can be reduced by decreasing the reactor size, i.e., the area of the reactor walls. However, in the traditional travelling-wave pulsing methods the total pressure in the reactor feed line increases at the same time as the precursor partial pressure is increased in the line, which causes the pulses to be widened not only by these factors but also by pressure gradient driven flow.

Models on mass transport in ALD type reactors are based on diffusion and the "memory effect". These models have neglected the effect generated by the pressure gradient, whereby they have not been able to explain the long purge times needed in real-life reactors.

Prior attempts to increase the efficiency of travelling wave ALD reactors have, in practice, been concentrated on an improvement of the exposure of the substrate and the efficiency of purging. WO 04/083485 discloses a method of using a bi-level purge gas flow rate for decreasing the cycle time of the process. A low inert gas flow rate or pressure is used during pulses and a high flow rate or pressure is used for purging. The switching of the flows can be timed so as to break existing turbulence within the reaction chamber, in order to accelerate exhaustion of the particles from the chamber. By this method, both the substrate exposure time and purging time can be shortened. In WO 03/062490, there is described a more disadvantageous bi-level purge gas system, wherein a part of the inert gas flow is conducted to a conduit which bypasses the reactor during feed of reactant pulses in order to increase the share of the precursor in the vicinity of the substrate. Such a method is very gas-consumptive.

Both publications mentioned above concern methods of intensifying the exposure of the substrate to the precursor flow and minimizing the purge time. However, the technical solutions suggested in the art are far from optimal, because they do not take into account the effect of the flow driven by the pressure gradient on the pulse widening. In addition, the reactor design downstream of the reaction chamber is critical in order to maintain an essentially constant pressure in the reaction space.

SUMMARY OF THE INVENTION

It is an aim of the invention to eliminate at least some of the problems of the prior art and to provide an improved ALD method, which is faster and produces better quality thin films than the conventional methods available today.

It is another aim of the invention to achieve a method that minimizes film growth on the walls of the ALD reactor.

It is yet another aim of the invention to provide an ALD method, wherein the design of the reactor downstream of the pulse introduction point becomes less critical.

It is still another aim of the invention to provide an ALD method that is economical with respect to the operational costs, including material consumption and productivity, and equipment maintenance costs.

These and other objects, together with the advantages thereof over known processes, are achieved by the embodiments of the present invention as hereinafter described and claimed.

The illustrated embodiments of present invention prevent pressure gradient driven intermixing of precursor pulses and purge gas columns by controlling the gas pressures in the reactor feed line. In particular, the embodiments provide for operation of an ALD process by maintaining the total pressure of the line during the inert gas pulses (in the following also "inactive gas pulses") fed into the reactor between precursor pulses at a higher, or at least equal, pressure than during the precursor pulses. Thus, the pressure in the feed line is during purge at least the same, and typically somewhat higher, for example 0.01 to 1000%, usually 0.01 to 100% and advantageously 0.01 to 10%, than the pressure in the feed line during the feed of a preceding or a subsequent precursor pulse. In some cases, where a very high pressure purging is desired, the feed line pressure during purge may even be more than 10,000-fold compared with the pressure of the precursor pulse.

In this way, formation of pulse-widening pressure gradients directed from the precursor pulse towards the inert gas column can be prevented. Actually, because of the slightly higher pressure of the inert gas columns, the precursor pulses are compressed between inert gas pulses until the pressure gradients are levelled out. In such a situation, the only pulse-widening effects acting upon the precursor pulses are caused by diffusion and gas-surface interaction.

In accordance with one embodiment of the invention, a method is provided for growing a thin film on a substrate by pulsing vapor-phase precursors into a reaction chamber according to an atomic layer deposition process. Method includes vaporizing at least one precursor from a source material maintained at a vaporized temperature. Pulses of the vaporized precursor are repeatedly fed via feed line into the reaction chamber at a first pressure, and are subsequently purged from the reaction chamber with pulses of inactive fed via the feed line at a second pressure. The second pressure is maintained equal to or higher than the first pressure separating successive pulses of the vaporized precursor from one another.

In accordance with another embodiment of the invention, a method is provided for growing a thin film on a substrate by pulsing vapor-phase precursors into a reaction chamber according to an atomic layer deposition process. Pulses of the vaporized precursor are repeatedly fed via feed line into the reaction chamber at a first pressure, and are subsequently purged from the reaction chamber with pulses of inactive fed via the feed line at a second pressure. The second pressure is maintained equal to or higher than the first pressure separating successive pulses of the vaporized precursor from one another.

Another embodiment of the invention comprises apparatus for growing thin films onto a substrate according to the ALD method. The apparatus includes a reaction chamber into whose reaction space the substrate can be transferred. An inactive gas source and a precursor source are connected to the reaction chamber through a feed line. A first conduit connects the precursor source to the feed line. A second conduit connects the inactive gas source to the feed line. A pressure sensor is configured to sense the pressure within the feed line. A flow control device is configured to control the flow of inactive gas in the second conduit. A controller is operatively connected to the pressure sensor and is configured to adjust the flow control device, at least in part, in response to the pressure sensed by the pressure sensor.

Considerable improvements are obtained by the methods described herein. Thus, by preventing a pressure gradient driven flow, the pulses and the intervals between the pulses can be kept shorter, which results in faster film growth, enables shorter precursor pulses and therefore improved pulse separation. Consequently, a substantial increase in the productivity of the ALD process and economical savings are achieved. It can be shown that at typical ALD conditions, a pressure gradient in the range of mTorrs spreads the precursor pulse ten times more effectively than diffusion. Hence, preventing detrimental pressure gradients directed from the precursor pulse to the inert gas pulses can significantly improve the productivity of travelling-wave ALD.

In addition, because much of the pressure control of the process is taken care of upstream of the reaction chamber, the reactor design downstream of the reactor chamber becomes less critical. That is, the apparatus for exhausting residual gas from the reactor can be kept as simple as possible, which further provides for shorter response times of the system and faster film growth.

Moreover, because the pulses of separate precursors are more distinct, undesired reactions of the precursors away from the substrate are minimized. As the deposition cycle in production-scale ALD systems is repeated millions of times, even a small intermixing of the precursor gases leads to significant film growth on the reactor walls and conduits. By means of the preferred, embodiments of the present invention, this undesired effect and the maintenance costs it can effectively be reduced.

BRIEF DESCRIPTION OF THE DRAWINGS

These aspects and others will be better understood from the detailed description and some working examples below, and from the appended drawings, which are meant to illustrate and not to limit the invention, and in which.

DETAILED DESCRIPTION OF THE PREFERRED EMBODIMENTS

Figures 1A, 1B:
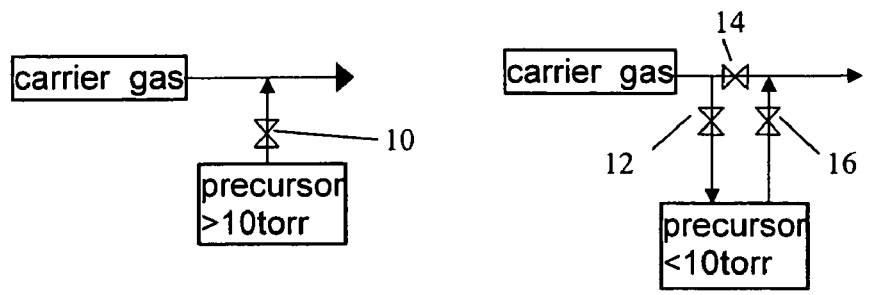
FIG. 1a shows a typical precursor source configuration used when the vapor pressure of the precursor is high.
FIG. 1b shows a typical source configuration used when the vapor pressure of the precursor is low.

In the context of the description herein, "an ALD type process" generally refers to a process for producing thin films over a substrate, in which a solid thin film is formed molecular layer by molecular layer due to self-saturating chemical reactions on heated surfaces. In the process, gaseous reactants, i.e. precursors, are conducted into a reaction space of an ALD type of a reactor and contacted with a substrate located in the chamber to provide a surface reaction. The pressure and the temperature of the reaction space, including the substrate, are adjusted to a range where physisorption (i.e. low temperature condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as angstroms per pulsing cycle (Å/pulsing cycle), depends, for example, on the number of available reactive surface sites on the surface and bulkiness of the chemisorbing molecules. Gas phase reactions between precursors and any undesired reactions of by-products are inhibited because precursor pulses are separated from each other by time and the reaction space is purged with an inactive gas (e.g., nitrogen or argon) precursor pulses to remove surplus gaseous reactants and reaction by-products from the chamber.

As known in the art, there are various variations of the basic ALD method, including PEALD (plasma enhanced ALD) in which plasma is used for activating reactants. Conventional ALD or thermal ALD refers to an ALD method where plasma is not used but where the substrate temperature is high enough for overcoming the energy barrier (activation energy) during collisions between the chemisorbed species on the surface and reactant molecules in the gas phase so that up to an atomic (elemental) or a molecular (compound) layer of thin film grows on the substrate surface during each ALD pulsing sequence. For the purpose of the present application, ALD includes both PEALD and thermal ALD.

In the context of the present application, "an ALD type reactor" means a reactor where the reaction space is in fluid communication with an inactive gas source and at least one, preferably at least two precursor sources that can be pulsed, i.e. the precursor vapor pushed from the precursor source can be introduced as a gas pulse into the reaction space, the reaction space is in fluid communication with a vacuum generator (e.g. a vacuum pump), and the temperature and pressure of the reaction space and the flow rates of gases can be adjusted to a range that makes it possible to grow thin films by ALD type processes.

"Precursor" and "source material" are used interchangeably in the present application to generally designate a volatile or gaseous compound (e.g., metal compound), which can be used as a starting compound for the component, e.g. element or metal oxide, of the thin film. In the present context, the term "precursor" refers to a vaporizable material capable of reacting with the substrate surface. In the ALD method, reactants belonging in two different groups are conventionally employed. The reactants may be solids, liquids or gases. The term "metallic reactants" refers generally to metallic compounds, which may even be elemental metals. Suitable metallic reactants are the halogenides of metals including chlorides and bromides, for instance, and metal-organic compounds such as the thd (2,2,6,6-tetramethyl-3,5-heptanedione) complex compounds and Cp (—$C_5H_5$, cyclopentadienyl) compounds. As examples of metallic reactants may be mentioned Zn, $ZnCl_2$, $TiCl_4$, $Ca(thd)_2$, $(CH_3)_3Al$ and (Cp)

$_2$Mg. The term "nonmetallic reactants" refers generally to compounds and elements capable of reacting with metallic compounds. The latter group is appropriately represented by water, sulfur, hydrogen sulfide, oxygen, ozone and ammonia and as well as plasmas of different nonmetallic reactants such as hydrogen or hydrogen/nitrogen mixture.

In the present context, the term "inactive" gas is used to refer to a gas, which is admitted into the reaction space and does not react with reactants and substrate and materials, which will be in contact with the inactive gas in the reactor. The inactive gas also serves for preventing reactions between the substances of the different reactant groups in, e.g., the inflow piping. Of inactive gases suited for use in the method, reference can be made to inert gases, such as nitrogen gas, and noble gases, e.g., argon. The inactive gas may also be an inherently reactive gas, such as hydrogen gas serving to prevent undesirable reactions, e.g., oxidization reactions, from occurring on the substrate surface.

In an ALD reaction, usually the reaction temperature can vary depending on the evaporation temperature of solid or liquid precursor and the decomposition temperature of the precursor. However, in certain cases it might be advantageous to use reaction temperature lower than the evaporation temperature of the precursor. The substrate temperature should be low enough to keep the bonds between thin film atoms intact and to prevent thermal decomposition of the gaseous reactants. On the other hand, the substrate temperature should be high enough to keep the source materials in gaseous phase, i.e., condensation of the gaseous reactants must be avoided. Further, the temperature should be sufficiently high to provide the activation energy for the surface reaction. As an example of a typical, but in no way limiting, range reaction temperatures of 20 to 500° C., in particular about 100 to 450° C., can be cited.

The deposition can be carried out at normal (i.e. ambient) pressure (1000 mbar), but it is generally preferred to operate the method at reduced pressure. For example, in many applications, the pressure in the reactor is 0.01-20 mbar, or more preferably 0.1-5 mbar.

At these conditions, the amount of reactants bound to the surface will be determined by the surface. This phenomenon is called "self-saturation".

For further details on the operation of a typical ALD process, reference is made to the documents cited above.

Before disclosing the preferred embodiments in detail, examples of reactor source configurations currently used will be briefly described with reference to FIGS. 1a and 1b. Traditionally, the pulses have been introduced in a viscous flow ALD reactor in two ways. First, if the vapor pressure of the precursor is high enough (e.g., usually greater than about 10 Torr), the precursor has been injected directly into a constant carrier gas flow through a valve 10 using its own vapor pressure. An example of this source configuration is shown in FIG. 1a. Second, if the vapor pressure of the precursor is low (e.g., below about 10 torr), the pressure in the line, where the pulse should be injected, is normally so high that the precursor does not flow in the line with its own vapor pressure. In this case, a constant carrier gas flow is normally cycled between the purge line and the pulse line. For example, in the configuration shown in FIG. 1b, valves 12, 14 and 16 are used so that during a pulse the precursor is pushed out from the source container with the carrier gas flow.

Figure 2:
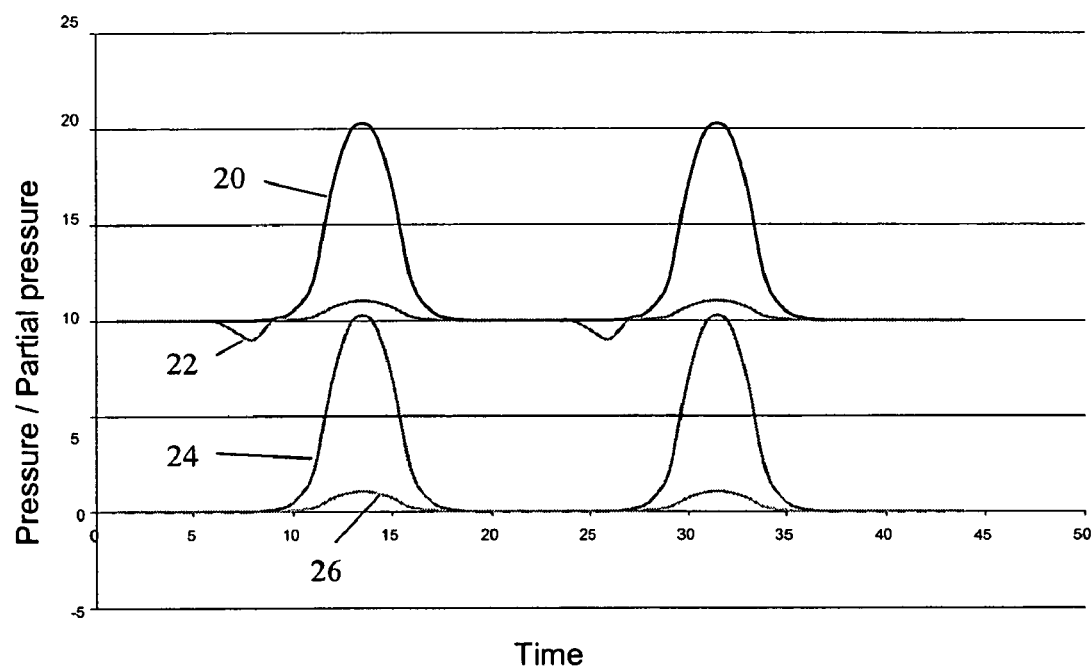
FIG. 2 shows the total pressure and partial pressure behaviour in the reactor feed line for the source configurations shown in FIGS. 1a and 1b.

The total gas pressure and the precursor partial pressure diagrams in the reactor feed line using the pulsing configurations shown in FIGS. 1a and 1b are shown in FIG. 2. In the configuration of FIG. 1a, the total pressure 20 increases during the pulse injection by the precursor partial pressure 24. Hence, because the total pressure during the pulse is higher than the total pressure during the carrier gas flow, right before and right after the injection there is a high pressure gradient directed from the pulse to the inactive gas column (i.e. the inactive gas between precursor pulses), which spreads the precursor pulse. In the configuration of FIG. 1b, the contribution of the precursor pulse to the total pressure 22 is smaller due to its lower partial pressure 26, but the detrimental pressure gradient described above is still established. In addition, a small drop in the total pressure 22 in the feed line is seen in the beginning of the precursor pulse because of the contribution of the precursor container volume to the total volume of the system. That is, the total pressure drops as the inactive gas fills the precursor container.

Figure 3:
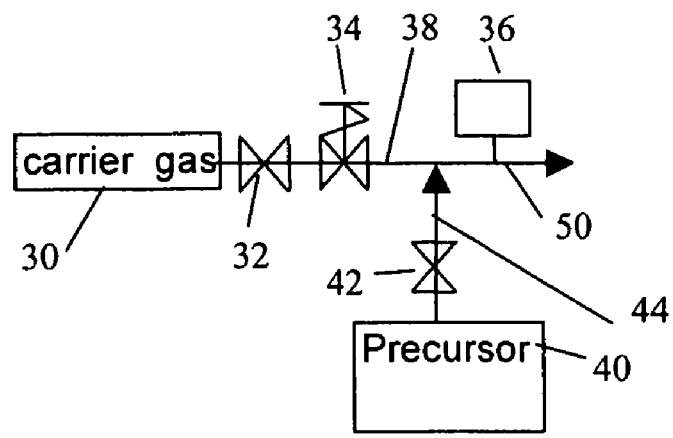
FIG. 3 shows a source configuration used in a preferred embodiment of the invention.

An exemplary embodiment of the present invention is shown in FIG. 3. In this illustrated embodiment, source material is vaporized from a precursor source container 40, which is maintained at a vaporizing temperature. The vaporized precursor is pulsed via a chamber feed line 50 into an ALD-type reaction chamber, which contains at least one substrate (not shown). The substrate can be of any of a variety of types. Examples include silicon, silica, coated silicon, germanium, silicon-germanium alloys, copper metal, noble and platinum metals group including silver, gold, platinum, palladium, rhodium, iridium and ruthenium, various nitrides, such as transition metal nitrides, e.g. tantalum nitride TaN, various oxides, such as platinum group metal oxides, e.g. ruthenium dioxide $RuO_2$, various carbides, such as transition metal carbides, e.g. tungsten carbide WC, and transition metal nitride carbides, e.g. tungsten nitride carbide $WN_xC_y$. Conventionally, the preceding thin film layer deposited will form the substrate surface for the next thin film.

From the source material container 40, the precursor vapor is conducted to the feed line 50 via a first conduit 44, the first conduit having a connection point with the feed line 50. After the precursor pulse, inactive gas is injected into the reaction chamber via a second conduit 38, which is also connected to the feed line 50 at a connection point, to purge the reaction chamber from precursor residues and redundant reaction products. The pulsing and purging cycles are repeated so as to form a film of a desired thickness. As will be explained below, the precursor is fed with a flow rate leading to a first feed line pressure $P_1$ (i.e., the maximum value of the curve 62 shown in FIG. 4) and the inactive gas is fed with a flow rate leading to a second feed line pressure $P_2$ (maximum value of the curve 60 shown in FIG. 4).

An advantage of this embodiment is that the flow rates of the precursor pulse and the successive inactive gas column are chosen such that the first feed line pressure $P_1$ is less than or equal to the second feed line pressure $P_2$. By this arrangement, the pressure gradient driven flow is either minimized, or directed such that the precursor pulse is squeezed rather than spread due to the pressure gradient.

In practice, the adjustment of the flows can, for example, be done as follows:

First, the pressure in the feed line 50 is determined for the situation where the only flow in the feed line is that of the precursor emanating from the source material container 40. For example, in the illustrated embodiment, this pressure is determined by direct measurement using a pressure gauge 36 in the feed line 50. In other embodiments, the pressure may be determined by measuring the saturation vapor pressure of the precursor in the source material container and calculating the anticipated feed line pressure, or by pure calculations using pre-measured data on precursor and ALD reactor properties.

After that, a rate of inactive gas flow is selected that leads to a feed line pressure that is slightly higher than the pressure of the precursor flow. Again, a suitable flow rate can be estimated using system data. Additionally, if direct measurements in the feed line are carried out, the flow can be adjusted during the deposition process and set at a constant value. Alternatively, the flow may vary during the process for compensating any leaking of the system.

Then, the precursor is pulsed and the flow of the inactive gas is shut down during the pulse injection and opened again after the pulse injection. The pulsing and regulation of the flows is preferably carried out using at least one Mass Flow Controller (MFC) and valves as explained later in this document.

Conventionally, in ALD several successive pulsing and purging cycles are employed, the pulsed matter consisting of a plurality of, usually two, different precursors, depending on the desired film composition. The different precursors may be fed through the same feed line or separate feed lines may be used for each precursor. In the former case, the first conduits used for transporting the different precursors from the precursor sources are combined using a mixer structure before connecting to the feed line at a connection point. The mixer structure preferably comprises a concentric mixer structure. However, attention has to be paid to the fact that different precursors also have different evaporation rates and saturation vapor pressures, which results in fluctuations in pressures prevailing in the feed line. In one embodiment, the flow rate of the inactive gas fed subsequently to a precursor pulse can be determined individually for each precursor. In doing so, however, there may arise situations, where the second pressure, although being higher or equal to the feed line pressure of the preceding pulse, is lower than the pressure of the next precursor pulse. This would result in a disadvantageous pressure gradient. Several more advantageous approaches to overcome this problem are discussed in the following.

In one preferred embodiment of the invention, the second feed line pressure is selected such that it is greater or equal to the pressure of the feed line during pulsing of the precursor which has the highest evaporation rate. In this manner, the feed line purge pressure may be kept higher or at least equal to the precursor pulse pressure for each precursor-inactive gas interface.

Figure 4:
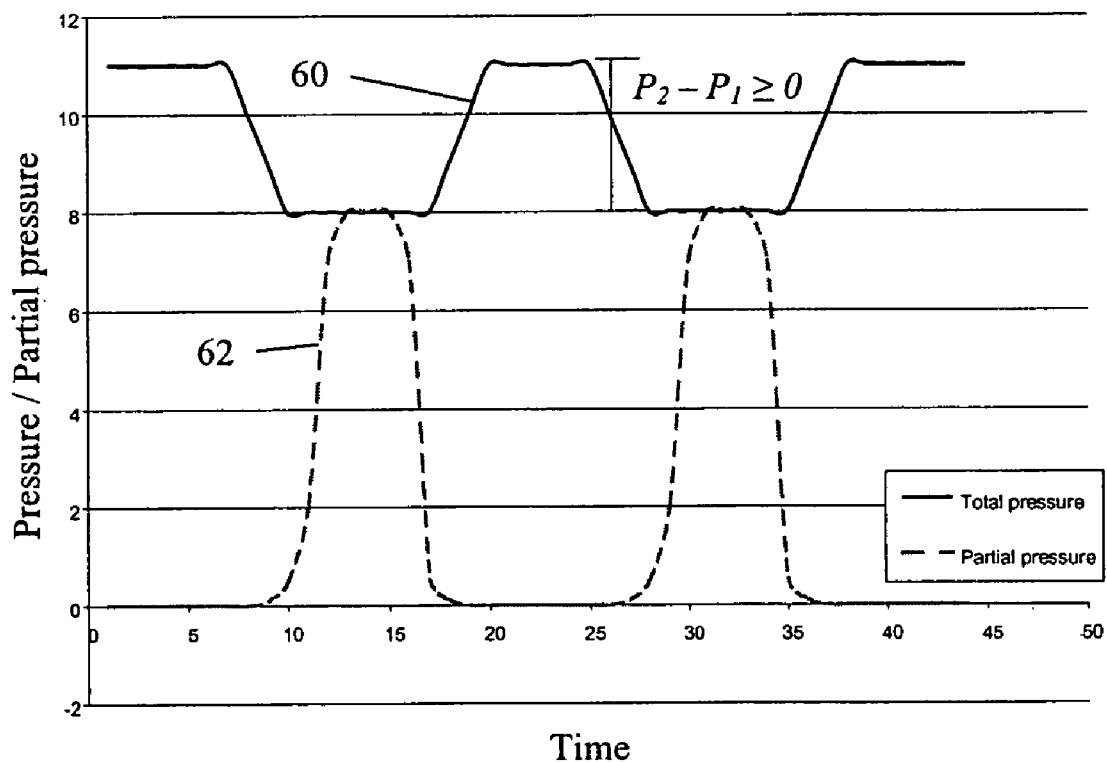
FIG. 4 shows the total pressure and partial pressure behaviour at the reactor feed line in the improved pulsing scheme according to preferred embodiments of the invention.

As mentioned above, the ALD type process is generally carried out at a pressure of about 0.01 to 1000 mbar, more typically at a pressure of about 0.1 to 20 mbar, and in particular about 5 mbar at the most. The pressure of the inactive gas fed between pulses of vaporized source material is in one embodiment, at least about 0.01% higher than the pressure in the feed line during the feed of a preceding or subsequent reactant pulse. In other embodiments, the pressure of the inactive gas between pulses is at least 1% higher, in another embodiment, at least 50% higher, in another embodiment up to 100% higher, in another embodiment about up to 250% higher, or in yet another embodiment up to about 1000% higher than the pressure in the feed line during the feed of a preceding or a subsequent reactant pulse. Thus, in practice, when a low-pressure type ALD process is operated, the absolute pressure of the reactant pulses are, in one example embodiment, generally maintained in the range of about 0.1 to 20 mbar and the pressure of the inactive gas is maintained in the range of about 0.10001 to 40 mbar, depending on the pressure, and more typically about 0.105 to 30 mbar, while always ensuring that the pressure of the succeeding/preceding inactive gas pulse is higher than (or equal to) the pressure of the preceding/succeeding precursor pulse. A single example of an advantageous pressure configuration is seen in FIG. 4, in which the pressure scale on the vertical axis of the diagram is thought to be millibars. In that case, the pressure 62 of the vaporized source material is 8 mbars and the pressure 60 of the inactive gas columns is about 37% higher than that, namely 11 mbars.

In one particularly advantageous embodiment, there are provided pressure control system that is configured such that the pulsing pressure in the feed line can be equalized regardless of the different vaporizing properties of the precursors. The pressure control system is preferably a single unit located in the feed line, but it may also comprise decentralized units provided individually for each precursor in the first conduits of the precursors. By this system the flow rate of the inactive gas can be optimally determined to result in a slightly higher purging feed line pressure than the equalized pulsing pressure.

If the saturation vapor pressure of some precursor material is too small for a laminar flow to form or the saturation vapor pressures of the different precursors are significantly uneven, the feed line pressure can be increased by diluting the precursor vapor with some inactive carrier gas. In such a case, a mixture of the precursor and carrier gases is pulsed into the reaction chamber rather than a gas comprising 100% of the precursor, the total pressure in the feed line being the sum of the partial pressures of the gases in the feed line. The carrier gas may be supplied to the precursor container via a conduit, which is called "the third conduit" in this text. Advantageously it is drawn from a separate gas reservoir, not from the second conduit carrying the inactive purging gas, because the pressure conditions in the second conduit are to be kept as stable as possible.

According to a preferred embodiment of the invention, the first and second conduits contain one valve each. Referring to FIG. 3, these valves are denoted with the reference numbers 32 and 42. Any of a variety of types of valves can be used, such as, for example, solenoid-type valves (e.g. solenoid operated throttle valve), pneumatic valves (e.g. pneumatically activated metal membrane valves), valve discs operated by the precursor transfer gas and gravity, Mass Flow Controller (MFC) type valves, fast acting piezoelectric valves, and other types of mechanical valves. The valves can be conventional fully closing valves or of a non-fully closing type, as explained in our earlier U.S. patent application Ser. No. 10/333,521 filed on Apr. 1, 2003, the teachings of which are herewith incorporated by reference. In addition, Inert Gas Valving (IGV) may also be used to control the precursor flows. In such an embodiment, a hot drain system including a draining conduit may be connected to the first conduit between the precursor source 40 and the connection with the feed line 50. In more detail, the use of IGV is explained in our U.S. Pat. No. 6,783,590 dated Aug. 31, 2004, the contents of which are herewith incorporated by reference.

The magnitudes of the flows of the inactive purging gas, and optionally the vaporized precursor are controlled using MFCs or Flow Ratio Sequencers (FRSs). Preferably, the inactive gas is fed through a MFC or other regulator 34 placed in the second conduit. In case carrier gas is used for pressurizing the precursor vapor, the carrier gas is preferably apportioned using an MFC or an FRS or an electronic pressure controller (PC) in the third conduit.

To facilitate the adjustments described herein, the pressure gauge 36 may be operatively connected to a control unit, which is in turn, may be operatively connected to the valves 32, 42 and/or the controller 34. The control unit generally comprises a general purpose computer or workstation having a general purpose processor and memory for storing a computer program that can be configured for performing the steps and functions described herein. In the alternative, the unit can comprise a hard wired feed back control circuit, a dedicated processor or any other control device that can be constructed for performing the steps and functions described herein.

The following step-by-step example partly according to FIGS. 3 and 4 illustrates one embodiment of use having certain features and advantages according to the present invention:

In a first step, the reaction chamber is initially kept at a high vacuum, while the valve 42 in the first conduit 44 is closed and the vapor-phase precursor in the source material container 40 is at saturation pressure. The valve 32 is in an open condition and the flow controller 34 emits inactive gas from the inactive gas source 30 at a full flow rate.

In a second step, the valve 42 in the first conduit 44 is then opened while approximately or essentially at the same time the valve 32 in the second conduit 38 is closed to inject a short pulse of the precursor into the reaction chamber.

In a third step, the pressure gauge 36 in the feed line 50 detects a feed line pressure (e.g., 8 mbars in the illustrated embodiment) during the precursor pulse injection. The MFC 34 is then set to limit the flow of the inactive gas to a value, which leads to a feed line pressure that is a predetermined value (e.g., 37%) higher than the feed line 50 pressure during the precursor pulse (e.g., 11 mbars vs. 8 mbars in the illustrated embodiment).

In a fourth step, the valve 42 in the first conduit 44 is then closed and at about or essentially the same time the valve 32 in the second conduit 38 is opened to allow inactive gas to purge the reaction chamber. The pressure gauge 36 detects the intended feed line pressure (e.g., 111 mbars in the illustrated embodiment).

In a fifth step, the second step described above is repeated for another precursor.

In a sixth step, the feed line pressure of the another precursor is measured using the pressure gauge 36 in the feed line 50. If a feed line pressure higher than the previous pulse pressure (e.g., 8 mbars) is detected, the flow controller 34 is adjusted for a new, higher flow rate.

In a seventh step, the second, fourth and fifth steps repeated in the order 4-2-4-5-4-2-4-5-4 . . . until the desired film thickness in achieved.

The methods which are described and illustrated above are not limited to the exact sequence of acts and/or steps described, nor is it necessarily limited to the practice of all of the acts and/or steps set forth. Other sequences of steps or events, or less than all of the events, or simultaneous occurrence of the events, may be utilized in practicing the embodiments disclosed herein.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow.

I claim:

1. A method of growing a thin film on a substrate by pulsing vapor-phase precursors material into a reaction chamber according to the ALD method, comprising:
   vaporizing at least one precursor from a source material container maintained at a vaporizing temperature;
   repeatedly feeding pulses of said vaporized precursor via a feed line into said reaction chamber at a first pressure and subsequently purging said reaction chamber with pulses of inactive gas fed via said feed line at a second pressure; and
   maintaining said second pressure higher than said first pressure for separating successive pulses of said vaporized precursor from each other.

2. The method according to claim 1, wherein said second pressure is in the range of about 0.01% to about 100% higher than said first pressure.

3. The method according to claim 2, further comprising using a pressure control unit in the feed line for equalizing the feed line pressures caused by pulsing of the different precursors.

4. The method according to claim 1, wherein the steps of vaporizing at least one precursor from a source material container and repeatedly feeding pulses of said vaporized precursor via a feed line further comprise vaporizing each at least two different precursors from their own source containers and successively feeding individual pulses of said at least two different precursors into said reaction chamber.

5. The method according to claim 4, further comprising feeding said individual pulses of said at least two different precursors via their own feed line into said reaction chamber.

6. The method according to claim 5, further comprising uniting the different precursors within a mixer structure before connecting to the feed line at a connection point.

7. The method according to claim 6, wherein the mixer structure comprises a concentric mixer structure.

8. The method according to claim 4, further comprising feeding said individual pulses of said at least two different precursors via the same feed line into said reaction chamber.

9. The method according to claim 4, further comprising determining the flow rate of said inactive gas fed subsequently to a precursor pulse individually for each of said precursors.

10. The method according to claim 4, further comprising determining the flow rate of said inactive gas according to the precursor having the highest evaporation rate such that the pressure of said inactive gas pulse is higher than the pressure of any of the precursor pulses.

11. The method according to claim 1, further comprising maintaining a partial pressure of the precursor in the feed line during pulsing such that it is essentially equal to the first pressure.

12. The method according to claim 1, further comprising injecting inactive carrier gas into said source material container via a third conduit for increasing the pressure of said vaporized precursor fed into said feed line.

13. The method according to claim 12, further comprising pulsing a mixture of said inactive carrier gas and said vaporized precursor into said reaction chamber in a first phase of operation.

14. The method according to claim 1, further comprising monitoring the pressure in the feed line.

15. The method according to claim 14, further comprising using the monitored pressure in the feed line to control the flow rates of the precursor and inactive gas.

16. The method according to claim 1, further comprising
   in a first phase of operation, delivering said vaporized precursor from said source material container into said reaction chamber via a first conduit connected to said feed line at a connection point at a flow rate corresponding to said first pressure;
   in a second phase of operation, delivering said inactive gas into said reaction chamber via a second conduit connected to said feed line at a connection point at a flow rate corresponding to said second pressure; and
   adjusting the flow rates of said vaporized precursor and said inactive gas such that said second pressure is higher than or equal to said first pressure.

17. The method according to claim 16, further comprising providing a valve in said first conduit.

18. The method according to claim 17, wherein the valve is selected from the group of consisting of fully closing solenoid-type valves, non-fully closing solenoid-type valves, pneumatic valves, Mass Flow Controllers, and fast acting piezoelectric valves.

19. The method according to claim 17, wherein said valve is implemented using an Inert Gas Valving technique.

20. The method according to claim 19, further comprising providing a valve in the second conduit.

21. The method according to claim 20, wherein said valve is selected from the group of consisting of fully closing solenoid-type valves, non-fully closing solenoid-type valves, pneumatic valves, Mass Flow Controllers, and fast acting piezoelectric valves.

22. The method according to claim 16, further comprising injecting inactive carrier gas into said precursor container via a third conduit for increasing the pressure of said vaporized precursor fed into said feed and providing a Mass Flow Controller or Flow Ratio Sequencer or Electronic Pressure Control (PC) in at least one of said second and said third conduit.

23. The method according to claim 16, further comprising
   determining said first pressure by injecting gas from said precursor source while keeping the inactive gas flow substantially at zero, and
   choosing said second pressure based on the determined first pressure by controlling the magnitude of the inactive gas flow.

24. The method according to claim 23, further comprising repeatedly pulsing the vaporized precursor from said source material container while the flow of inactive gas is kept disabled during the first phase of operation and enabled during the second phase of operation.

25. The method according to claim 24, further comprising alternately pulsing at least two precursors are from at least two precursor source containers via at least two first conduits and one or more feed lines.

26. A method of growing a thin film on a substrate by pulsing vapor-phase precursors material into a reaction chamber according to the ALD method, comprising:
   repeatedly feeding pulses of a vaporized precursor via a feed line into said reaction chamber at a first pressure and subsequently purging said reaction chamber with pulses of inactive gas fed via said feed line at a second pressure; and
   maintaining said second pressure higher than said first pressure for separating successive pulses of said vaporized precursor from each other.

* * * * *

(12) EX PARTE REEXAMINATION CERTIFICATE (10516th)

United States Patent
Blomberg

(10) Number: US 7,846,499 C1
(45) Certificate Issued: Mar. 3, 2015

(54) METHOD OF PULSING VAPOR PRECURSORS IN AN ALD REACTOR

(75) Inventor: Tom E. Blomberg, Vantaa (FI)

(73) Assignee: ASM International N.V., Helsinki (NL)

Reexamination Request:
No. 90/013,144, Feb. 3, 2014

Reexamination Certificate for:
Patent No.: 7,846,499
Issued: Dec. 7, 2010
Appl. No.: 11/026,208
Filed: Dec. 30, 2004

(51) Int. Cl.
*C23C 16/455* (2006.01)
*C30B 25/14* (2006.01)

(52) U.S. Cl.
CPC ................... *C23C 16/45527* (2013.01)
USPC ................. 427/255.23; 427/255.28; 117/85; 117/89

(58) Field of Classification Search
None
See application file for complete search history.

(56) References Cited

To view the complete listing of prior art documents cited during the proceeding for Reexamination Control Number 90/013,144, please refer to the USPTO's public Patent Application Information Retrieval (PAIR) system under the Display References tab.

*Primary Examiner* — Timothy Speer

(57) ABSTRACT

A method of growing a thin film on a substrate by pulsing vapor-phase precursors material into a reaction chamber according to the ALD method. The method comprises vaporizing at least one precursor from a source material container maintained at a vaporizing temperature, repeatedly feeding pulses of the vaporized precursor via a feed line into the reaction chamber at a first pressure, and subsequently purging the reaction chamber with pulses of inactive gas fed via the feed line at a second pressure. The second pressure is maintained at the same as or a higher level than the first pressure for separating successive pulses of said vaporized precursor from each other.

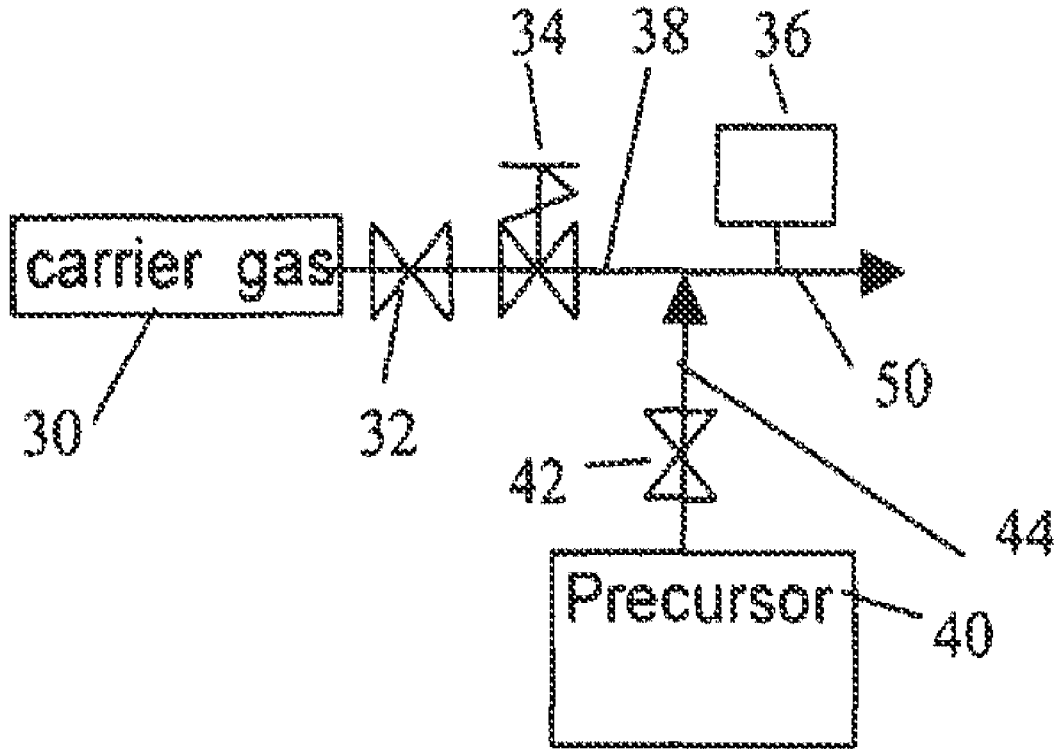

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1 and 26 is confirmed.

New claims 27-40 are added and determined to be patentable.

Claims 2-25 were not reexamined.

27. *The method according to claim 1, wherein maintaining said second pressure higher than said first pressure for separating successive pulses of said vaporized precursor from each other comprising maintaining said second pressure higher than said first pressure at a location upstream of a connection point at which different precursor paths unite.*

28. *The method according to claim 1, wherein maintaining said second pressure higher than said first pressure for separating successive pulses of said vaporized precursor from each other comprises maintaining said second pressure higher than said first pressure at a specific location along the feed line.*

29. *The method according to claim 1, further comprising providing within said feed line a positive pressure gradient between a pulse of vaporized precursor and a subsequent pulse of inactive gas.*

30. *The method according to claim 1, further comprising compressing a pulse of vaporized precursor within said feed line between immediately preceding and succeeding pulses of inactive gas.*

31. *The method according to claim 1, wherein at a point within said feed line a minimum pressure in said pulses of inactive gas is higher than maximum pressures in pulses of said vaporized precursor.*

32. *The method according to claim 1, wherein at a point within said feed line a pressure in said pulses of inactive gas are maintained higher than maximum pressures in pulses of said vaporized precursor during an entire period of said pulses of inactive gas.*

33. *The method according to claim 26, wherein maintaining said second pressure higher than said first pressure for separating successive pulses of said vaporized precursor from each other comprising maintaining said second pressure higher than said first pressure at a location upstream of a connection point at which different precursor paths unite.*

34. *The method according to claim 26 wherein maintaining said second pressure higher than said first pressure for separating successive pulses of said vaporized precursor from each other comprises maintaining said second pressure higher than said first pressure at a specific location along the feed line.*

35. *The method according to claim 26 further comprising providing within said feed line a positive pressure gradient between a pulse of vaporized precursor and a subsequent pulse of inactive gas.*

36. *The method according to claim 26, further comprising compressing a pulse of vaporized precursor within said feed line between immediately preceding and succeeding pulses of inactive gas.*

37. *The method according to claim 26, wherein at a point within said feed line a minimum pressure in said pulses of inactive gas is higher than maximum pressures in pulses of said vaporized precursor.*

38. *The method according to claim 26, wherein at a point within said feed line a pressure in said pulses of inactive gas are maintained higher than maximum pressures in pulses of said vaporized precursor during an entire period of said pulses of inactive gas.*

39. *The method according to claim 1, further comprising providing within said feed line a negative pressure gradient between a pulse of inactive gas and a subsequent pulse of vaporized precursor.*

40. *The method according to claim 26, further comprising providing within said feed line a negative pressure gradient between a pulse of inactive gas and a subsequent pulse of vaporized precursor.*

* * * * *